United States Patent
Naso et al.

(10) Patent No.: US 7,738,310 B2
(45) Date of Patent: Jun. 15, 2010

(54) FUSE DATA ACQUISITION

(75) Inventors: Giovanni Naso, Sabaudia (IT); Stefano Donnola, Spoleto (IT)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 12/032,928

(22) Filed: Feb. 18, 2008

(65) Prior Publication Data
US 2009/0067252 A1 Mar. 12, 2009

(30) Foreign Application Priority Data
Sep. 6, 2007 (IT) .................... RM2007A0461

(51) Int. Cl.
*G11C 17/18* (2006.01)
*G11C 17/00* (2006.01)
*H01L 7/00* (2006.01)
*H01H 85/00* (2006.01)

(52) U.S. Cl. .................. 365/225.7; 365/96; 327/143; 327/525

(58) Field of Classification Search ............ 365/225.7
See application file for complete search history.

(56) References Cited

U.S. PATENT DOCUMENTS

| | | | | |
|---|---|---|---|---|
| 5,734,280 A | * | 3/1998 | Sato ..................... 327/143 |
| 5,852,580 A | * | 12/1998 | Ha ...................... 365/200 |
| 5,905,687 A | * | 5/1999 | Brede et al. ............ 365/222 |
| 6,021,067 A | * | 2/2000 | Ha ...................... 365/185.21 |
| 6,107,847 A | * | 8/2000 | Johnson et al. ......... 327/143 |
| 6,141,247 A | | 10/2000 | Roohparvar et al. |
| 6,417,704 B1 | * | 7/2002 | Nakajima et al. ....... 327/143 |
| 6,590,825 B2 | | 7/2003 | Tran et al. |
| 6,720,808 B1 | * | 4/2004 | Chan .................. 327/143 |
| 6,784,704 B2 | * | 8/2004 | Sato .................... 327/143 |
| 6,842,371 B2 | * | 1/2005 | Liu .................... 365/185.04 |
| 7,002,828 B2 | | 2/2006 | Santin et al. |
| 7,116,590 B2 | | 10/2006 | Blodgett |
| 7,196,950 B2 | | 3/2007 | Kanda et al. |
| 7,209,387 B2 | | 4/2007 | Yip |
| 7,209,403 B2 | | 4/2007 | Santin |
| 2007/0058316 A1 | * | 3/2007 | Lim et al. ............. 361/104 |

* cited by examiner

*Primary Examiner*—Son L Mai
(74) *Attorney, Agent, or Firm*—Brook, Cameron & Huebsch, PLLC

(57) ABSTRACT

One or more embodiments of the present disclosure provide methods, devices, and systems for operating memory devices having fuse circuits. One method embodiment includes detecting a signal indicating whether a voltage used during operation of at least one of a number of fuse circuits has reached a threshold level, initializing at least one of the number of fuse circuits in response to detecting that the voltage has reached the threshold level, and reading an output of at least one of the number of fuse circuits at least partially in response to a detected state change of an output of the at least one initialized fuse circuit.

28 Claims, 6 Drawing Sheets

130

|  | 133-1 | 133-2 |
|---|---|---|
|  | fuse output=1 | fuse output=0 |
| fbias | VCC | VCC |
| sgd | VCC | VCC |
| Vread | 0 | 0 |
| sgs | VCC | VCC |
| T7 | ON (erased) | OFF (programmed) |
| T8 | OFF (programmed) | ON (erased) |
| L | 0 | VCC |
| R | VCC | 0 |
| foverride_ | VCC | VCC |
| T11 | ON | OFF |
| T12 | OFF | ON |
| Fout | VCC (1) | 0 |
| Frst | 0 | 0 |

FUSE DATA ACQUISITION

CROSS-REFERENCE TO RELATED APPLICATIONS

This application claims priority to Italian Patent Application Serial No. RM2007A000461, filed Sep. 6, 2007, the specification of which is incorporated herein by reference.

TECHNICAL FIELD

The present disclosure relates generally to semiconductor memory devices and, more particularly, to semiconductor memory devices having fuse circuits.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among other types of electronic systems.

Many memory devices include fuse circuits having memory cells which are used to store information referred to as fuse data. The fuse data can include, for example, redundancy addresses and data used to adjust the levels of various voltages and/or currents generated inside memory chips. Incorrect and/or unreliable data can be read from fuse circuits during power up of a memory device due to the fact that the supply voltage of the device is ramping to a VCC level. An incorrect fuse read operation can result in operational errors such as erroneous redundancy address selection or erroneous trimming operations, among others.

DETAILED DESCRIPTION

One or more embodiments of the present disclosure provide methods, devices, and systems for operating memory devices having fuse circuits. One or more method embodiment includes detecting a signal indicating whether a voltage used during operation of at least one of a number of fuse circuits has reached a threshold level, initializing at least one of the number of fuse circuits in response to detecting that the voltage has reached the threshold level, and reading an output of at least one of the number of fuse circuits at least partially in response to a detected state change of an output of the at least one initialized fuse circuit.

In the following detailed description of the present disclosure, reference is made to the accompanying drawings that form a part hereof and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1A:
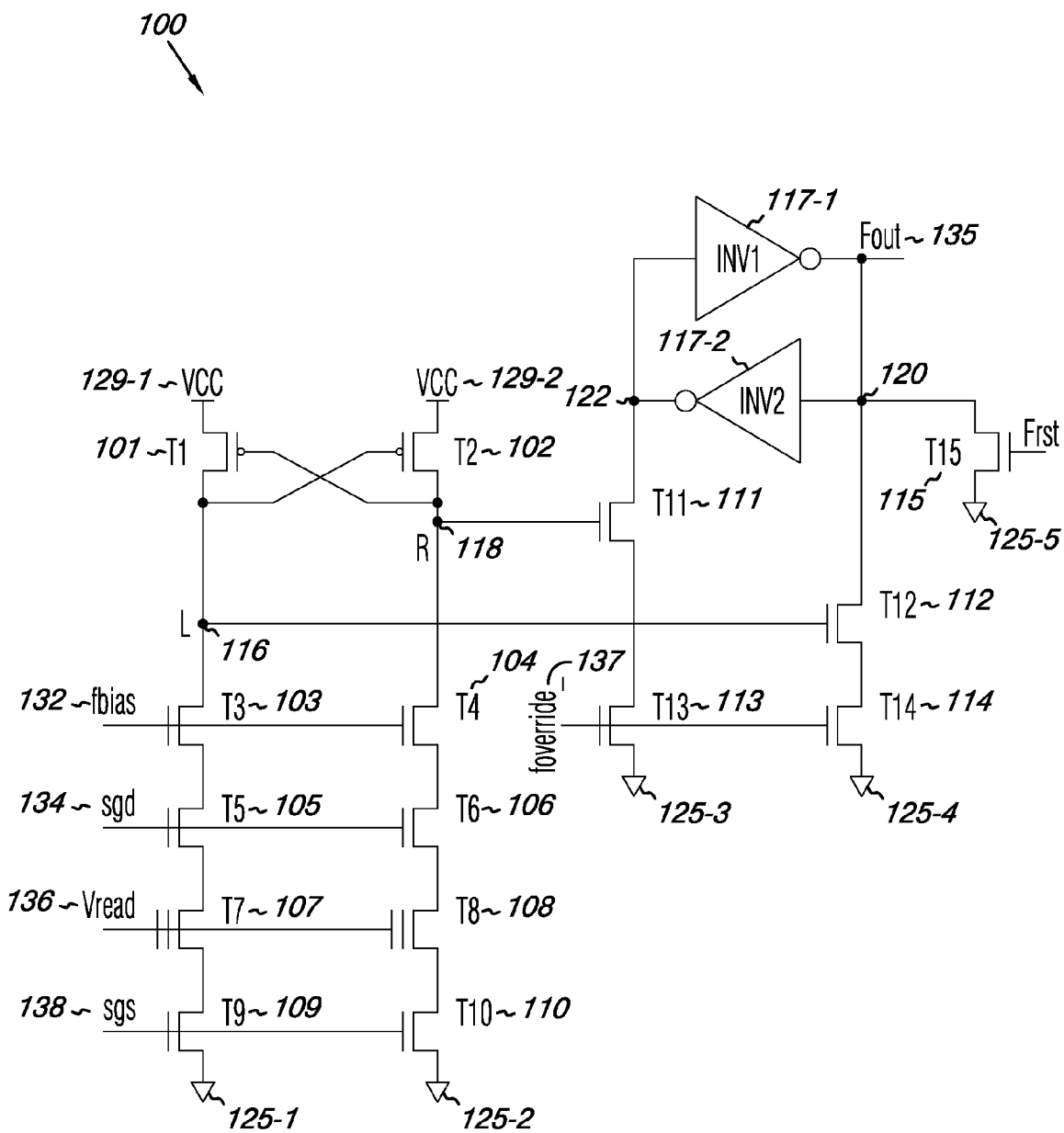
FIG. 1A illustrates an example of a fuse circuit that can be operated in accordance with embodiments of the present disclosure.

FIG. 1A illustrates an example of a fuse circuit 100 that can be operated in accordance with embodiments of the present disclosure. In one or more embodiments of the present disclosure, a fuse circuit can include a fuse element that can store a particular fuse data value, e.g., a logic "1" or a logic "0," which can be transferred to, and held by, a latch during a read operation performed on the fuse circuit. The fuse element can include one or more memory cells which are programmed or erased to store the particular fuse data value of the fuse circuit. In the embodiment illustrated in FIG. 1A, the fuse element of fuse circuit 100 includes a first memory cell 107 (T7) and a second memory cell 108 (T8). In one or more embodiments, the memory cells 107 and 108 are floating gate memory cells, e.g., field effect transistors having a floating gate.

In one or more embodiments, the memory cells 107 and 108 store complementary data values, e.g., one of the cells 107 and 108 stores a logic "1" and the other cell stores a logic "0". That is, the cells 107 and 108 store opposite data values, e.g., one of cells 107 and 108 is programmed and the other is erased. In such embodiments, the particular fuse data stored in the fuse element of circuit 100 depends on which of the cells 107 and 108 is programmed and which of the cells 107 and 108 is erased.

As described in connection with FIG. 4 below, a memory cell, e.g., 107 and 108, having a negative threshold voltage (Vt) level can refer to an erased cell, e.g., a cell having a Vt level which corresponds to an erased state. A memory cell, e.g., 107 and 108, having a positive Vt level can refer to a programmed cell, e.g., a cell having a Vt level which corresponds to a programmed state. In one or more embodiments, a programmed cell stores a logic "0" and an erased cell stores a logic "1." However, embodiments are not so limited, e.g., an erased cell can store a logic "0" and a programmed cell can store a logic "1" in some embodiments.

As one of ordinary skill in the art will appreciate, the Vt level of a memory cell can be adjusted by biasing the cell so as to add or remove charge from the floating gate of the cell via programming and or erasing operations. The Vt level of a fuse memory cell can be adjusted, e.g., increased or decreased, to store a desired data value via various programming and erasing operations known to those of ordinary skill in the art.

In the embodiment illustrated in FIG. 1A, the sources of memory cells 107 and 108 are connected to n-channel field effect transistors (nFETs) 109 (T9) and 110 (T10), respectively, and the drains of memory cells 107 and 108 are connected to nFETs 105 (T5) and 106 (T6), respectively. As such, the transistors 109 and 110 can be referred to as source select transistors 109 and 110 and the transistors 105 and 106 can be referred to as drain select transistors 105 and 106. In this embodiment, the drain selection transistors 105 and 106 are coupled to the sources of nFETs 103 (T3) and 104 (T4), respectively.

In the embodiment illustrated in FIG. 1A, the fuse circuit 100 includes a pair of cross-coupled p-channel field effect transistors (pFETs) 101 (T1) and 102 (T2). The sources of pFETs 101 and 102 are coupled to input nodes 129-1 and 129-2, respectively, which receive a power supply voltage (VCC). The pFETs 101 and 102 serve to bias to VCC the nodes 116 (L) and 118 (R), depending on the states of the memory cells 107 and 108, e.g., depending on which one of memory cells 107 and 108 conducts during a read operation performed on fuse circuit 100.

In order to read the data value stored by the fuse circuit 100, a particular data value stored by the memory cell 107 or 108 is transferred to, and held by, a data latch that includes a pair of reverse-coupled inverters 117-1 (INV1) and 117-2 (INV2), in this embodiment. As such, the transferred data value can be presented at output node 135 (Fout). Prior to reading the data value stored by fuse circuit 100, the output of the latch, e.g., output node 135, can be reset. In this embodiment, the fuse circuit includes a reset NFET 115 (T15) that can be activated, e.g., turned on, via a reset signal, e.g., Frst as shown in FIG. 1A. In response to a logic high reset signal Frst, the input to inverter 117-2 is brought to a ground potential via node 125-5, e.g., a logic low potential. As such, node 122 receives a logic high potential, e.g., VCC, and the output of inverter 117-1 is initialized to a logic low potential, e.g., logic "0". The reset transistor 115 is then deactivated prior to transferring the stored fuse data value to the latch output 135.

To transfer a particular fuse data value from the fuse element of fuse circuit 100, e.g., a data value stored in memory cells 107 and 108, to the latch output 135, the nFETs 103, 104, 105, 106, 109, 110, 113, and 114 are activated, e.g., turned on such that they are in a conducting state. In this embodiment, the nFETs 103 and 104 are activated via a logic high voltage, e.g., fbias 132, applied to the signal line coupling the control gates of nFETs 103 and 104. The nFETs 105 and 106 are activated via a logic high voltage, e.g., sgd 134, applied to the signal line coupling the control gates of nFETs 105 and 106. The nFETs 109 and 110 are activated via a logic high voltage, e.g., sgs 138, applied to the signal line coupling the control gates of nFETs 109 and 110. The nFETs 113 and 114 are activated via a logic high voltage, e.g., foverride_ 137, applied to the signal line coupling the control gates of nFETs 113 and 114. In one or more embodiments, the voltages 132, 134, 137, and 138 can be VCC.

A read voltage 136, e.g., Vread as shown in FIG. 1A, is applied to the signal line coupling the control gates of the floating gate memory cells 107 and 108 in order to initiate the transfer of a stored data value to the latch output 135. In various embodiments, the read voltage 136 is a voltage sufficient to activate an erased memory cell, e.g., 107 and 108, but insufficient to activate a programmed cell. Therefore, in embodiments in which the memory cells 107 and 108 are in complementary states, e.g., one of the cells is in a programmed state and the other is in an erased state, the nodes 116 (L) and 118 (R), are biased at different levels depending on the states of the memory cells 107 and 108. As an example, if cell 107 is in an erased state, then the cell 107 will be activated, e.g., placed in a conducting state, in response to the read voltage 136 such that node 116 (L) is brought to the ground potential of node 125-1. The ground bias voltage at node 116 (L) activates the pFET 102 such that node 118 (R) is biased at the voltage of node 129-2, e.g., VCC. Since node 118 (R) is biased at VCC, the pFET 101 remains deactivated.

The VCC bias voltage at node 118 (R) activates nFET 111 (T11) which pulls node 122, e.g., the input of inverter 117-1, to a ground voltage of node 125-3. As such, the fuse output 135, e.g., the output of inverter 117-1, receives a logic high value, e.g., a data "1" value. That is, a logic high data value is transferred to the fuse output 135 from the erased memory cell 107. In this example, node 116 (L) is biased at 0V such that nFET 112 (T12) is deactivated. However, in embodiments in which memory cell 108 is in an erased state and memory cell 107 is in a programmed state, node 116 (L) would be biased at VCC via node 129-1 and node 118 (R) would be biased at 0V via node 125-2 in response to the applied read voltage 136. In such embodiments, the nFET 111 would remain deactivated and the nFET 112 would be activated. The activation of transistor 112 would pull node 120 to the ground voltage of node 125-4, e.g., a logic low value. As such, the output of inverter 117-2, e.g., node 122, would be at a logic high value, and the fuse circuit output 135, e.g., the output of inverter 117-1, would be a logic low value, e.g., a data "0" value. In this manner, the particular fuse data value, e.g., a data "1" or "0," stored by the memory cells 107 and 108 can be transferred to the latch of fuse circuit 100 and presented at the fuse output 135.

Embodiments of the present disclosure are not limited to the fuse circuit embodiment described in connection with FIG. 1A. For example, although the fuse circuit 100 includes two memory cells, e.g., floating gate memory cells 107 and 108, some fuse circuit embodiments of the present disclosure can include a single memory cell or more than two memory cells. One example of another fuse circuit embodiment is described in commonly assigned U.S. Pat. No. 7,002,828, entitled "Flash Cell Fuse Circuit," filed on Aug. 18, 2003, which is incorporated herein by reference.

Figure 1B:
FIG. 1B is a table of example conditions associated with a read operation performed on the fuse circuit shown in FIG. 1A.

FIG. 1B is a table 130 of example conditions associated with a read operation performed on the fuse circuit 100 shown in FIG. 1A. Column 133-1 corresponds to an embodiment in which memory cell T7 is an erased cell and memory cell T8 is a programmed cell. As such, cell T7 is ON, e.g., activated, and cell T8 is OFF, when Vread, e.g., 0V in the embodiment shown in FIG. 1B, is applied to their respective control gates during a fuse read operation. In this embodiment, a logic high data value, e.g., "1," is transferred to the data latch of the fuse circuit 100 and is presented at fuse output Fout, e.g., 135 shown in FIG. 1A, based on the biasing conditions shown in column 133-1. Column 133-2 corresponds to an embodiment in which memory cell T7 is a programmed cell and memory cell T8 is an erased cell. As such, cell T7 is OFF, e.g., deactivated, and cell T8 is ON, when Vread is applied to their respective control gates during a fuse read operation. As shown in table 130, in this embodiment, a logic low data value, e.g., "0," is transferred to the data latch of the fuse circuit 100 and is presented at fuse output Fout, e.g., 135 shown in FIG. 1A, based on the biasing conditions shown in column 133-2.

In the embodiment of FIG. 1B, the conditions shown in table 130 represent steady conditions. However, as will be understood by one of ordinary skill in the art and as described further below in connection with FIGS. 2, 3, and 4, the power supply voltage, e.g., VCC, can be ramping from 0V to a steady VCC level during power up of a memory device. As such, an unstable situation can arise during a fuse read operation during power up of the memory device. For instance, a controller of the memory device may be signaled to acquire fuse data from a number of fuse circuits, e.g., fuse circuit 100 shown in FIG. 1A, before the VCC has reached a level sufficient to properly transfer the appropriate data value to the latch of the fuse circuit. In such cases, the acquired fuse data, e.g., the data value read from the fuse circuit, may be incorrect, which can lead to erroneous device operations.

Figure 2:
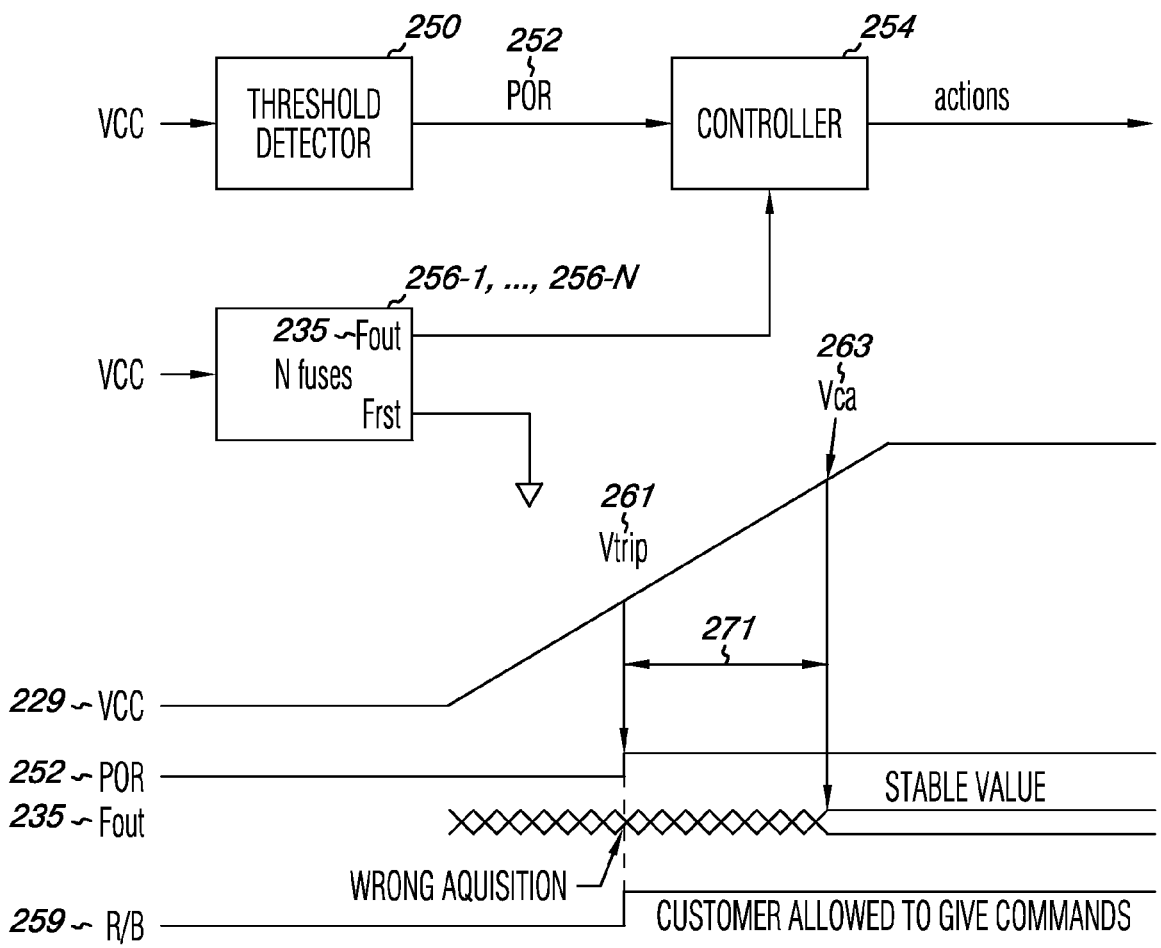
FIG. 2 illustrates a block diagram of a portion of a memory device having fuse circuits along with voltages and signals associated with a previous approach of acquiring fuse data.

FIG. 2 illustrates a block diagram of a portion of a memory device having fuse circuits along with voltages and signals associated with a previous approach of acquiring fuse data. The approach shown in FIG. 2 represents a previous approach to acquiring fuse data during power up of a memory device. As shown in FIG. 2, when the memory device is powering up, the power supply voltage 229 is ramping from an initial voltage, e.g., a ground potential, to a steady VCC level which may be about 2V-3V.

During power up of the memory device, a voltage threshold detection circuit, e.g., threshold detector 250, provides a power on reset signal POR 252 to control circuitry, e.g., controller 254, of the device when the ramping VCC 229 reaches a trip voltage 261. Upon receiving signal 252, the controller 254 can initialize, e.g., reset, various circuits within the device to prepare for various device operations, e.g., program, read, erase operations. Upon receiving signal 252, the controller 254 also begins a fuse read operation to acquire data from the output 235 of a number of fuses 256-1, ..., 256-N. That is, in response to the received signal 252, the controller 254 can reset the output 235 of fuses 256-1, ..., 256-N and can bias the fuses 256-1, ..., 256-N so as to transfer the data value stored by their respective memory cells to their respective latches as described in connection with FIGS. 1A and 1B.

However, in some cases, the trip voltage at which the controller receives the POK signal, e.g., signal 252, and begins a fuse data read operation can be less than a VCC voltage necessary to correctly read the fuses. As shown in FIG. 2, the VCC voltage level Vca 263 at which the fuse output 235 has a stable value is higher than the trip voltage Vtrip 261 at which the controller 254 performs the fuse data acquisition. As such, a fuse read operation performed on fuses 256-1, ..., 256-N when the supply voltage VCC 229 is at the Vtrip 261 level results in an incorrect data acquisition, e.g., the data value presented at output 235 does not correspond to the particular data value stored by the memory cells of the fuse circuits.

As shown in FIG. 2, in some previous approaches, a ready-busy signal 259 (R/B) of the device is provided when the VCC voltage reaches the trip voltage 261 detected by threshold voltage detector 250. As one of ordinary skill in the art will appreciate, the ready-busy signal 259 can be used to indicate when a customer or user of the memory device is allowed to give commands to operate on, e.g., program, erase, and/or read, an array of memory cells. If a user gives a command to start such an operation during the time 271 between when the ramping VCC 229 is at Vtrip 261 and Vca 263, e.g., when the fuse output 235 is unstable, then the acquired fuse data may be incorrect and the operation performed on the memory array will fail.

Figure 3:
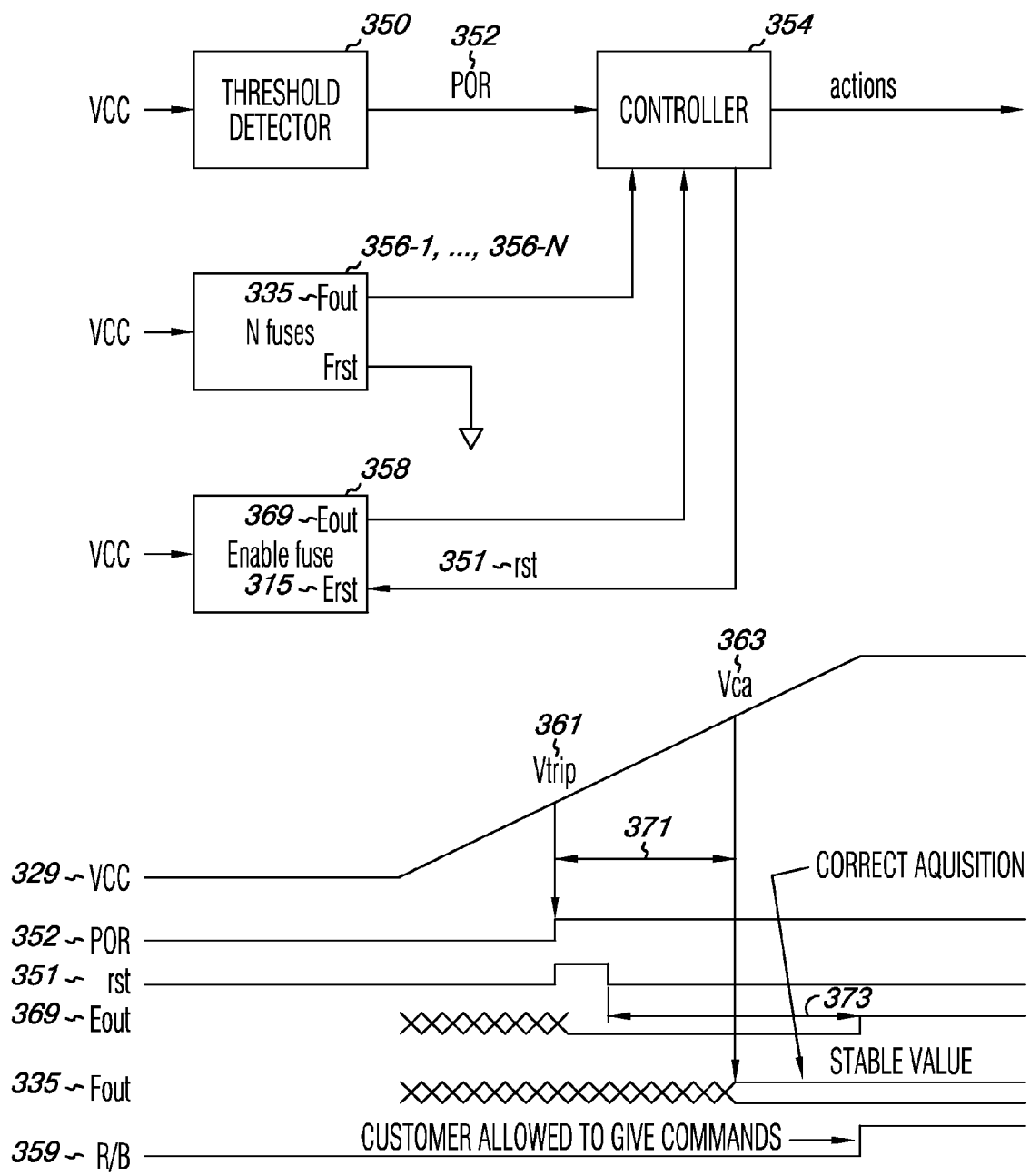
FIG. 3 illustrates a block diagram of a portion of a memory device having fuse circuits along with example voltages and signals associated with acquiring fuse data in accordance with an embodiment of the present disclosure.

FIG. 3 illustrates a block diagram of a portion of a memory device having fuse circuits along with example voltages and signals associated with acquiring fuse data in accordance with an embodiment of the present disclosure. In the embodiment illustrated in FIG. 3, the memory device includes a number of fuse circuits 356-1, ..., 356-N. In various embodiments, the fuse circuits 356-1, ..., 356-N can include one or more memory cells and a latch such as fuse circuit 100 described in connection with FIGS. 1A and 1B. In one or more embodiments of the present disclosure, and as shown in FIG. 3, the memory device includes an enable fuse circuit 358. In various embodiments, the physical configuration of the enable fuse circuit 358 can be the same as the fuse circuits 356-1, ..., 356-N.

As described further below, in various embodiments, the output 335 of one or more of the fuse circuits 356-1, ..., 356-N can be read in response to a detected state change of the output 369 of the enable fuse circuit 358. In such embodiments, a fuse element, e.g., memory cell 107 and 108 shown in FIG. 1A, of the enable fuse circuit 358 can be erased to a Vt level which is lesser in magnitude than Vt level to which a memory cell of the fuses 356-1, ..., 356-N is erased. Erasing a memory cell of the enable fuse circuit 358 to an erased Vt level lesser in magnitude than the erased Vt level of the memory cells of the fuses 356-1, ..., 356-N results in a slower transfer of a stored data value from the memory cell of the enable fuse circuit 358 to the latch of the fuse circuit 358 than the transfer of a stored data value from the memory cell of the fuse circuits 356-1, ..., 356-N to their respective latches. That is, as described further in connection with FIG. 4, an erased memory cell having a Vt level lesser in magnitude, turns on slower in response to a particular applied read voltage, e.g., Vread as shown in FIGS. 1A and 1B, than an erased memory cell having a Vt level higher in magnitude.

As described above, when a memory device is powering up, the power supply voltage can ramp from an initial voltage, e.g., a ground potential, to a steady VCC level which may be about 2V-3V. The ramp rate associated with the ramping power supply voltage upon power up of a memory device can vary and can depend on factors such as the battery charge on a battery of the device. Embodiments of the present disclosure are not limited to a particular VCC level or to a particular VCC ramp rate.

During power up of the memory device embodiment illustrated in FIG. 3, a voltage threshold detection circuit 350 provides a power on reset signal POR 352 to a controller 354 of the device when the ramping VCC 329 reaches a trip voltage 361. The trip voltage, e.g., Vtrip 361, can represent the VCC level at which the controller initializes, e.g., resets, various circuits within a memory device prior to perform device operations such as program, erase, and/or read operations, among other operations, on the memory array (not shown in FIG. 3) of the device.

In the embodiment illustrated in FIG. 3, the controller 354 provides a reset signal pulse 351 to the reset input Erst 315 of the enable fuse circuit 358 upon receiving the POR signal 252. The reset input 315 of the enable fuse circuit 358 can be a reset transistor such as reset transistor 115 shown in FIG. 1. The reset pulse 351 provided to the reset input 315 resets the enable fuse output Eout 369, e.g., to a logic low value as shown in this example.

Upon receiving signal 352, the controller 354 can also begin a fuse read operation to acquire data from the output 335 of the number of fuses 356-1, ..., 356-N. That is, in response to the received signal 352, the controller 354 can reset the output Fout 335 of fuses 356-1, ..., 356-N and can bias the fuses 356-1, ..., 356-N so as to transfer the data value stored by their respective memory cells to their respective latches as described in connection with FIGS. 1A and 1B.

However, as described above in connection with FIG. 2, a fuse read operation performed on the fuse circuits 356-1, ..., 356-N can yield unstable or incorrect results if the ramping VCC level 329 has not reached a sufficient level. For instance, as shown in embodiment of FIG. 3, the VCC level 329 at which the fuse output 335 is a stable, e.g., correct, value is shown as Vca 363. As such, the voltage Vca 363 represents the VCC level 329 at which the data value, e.g., logic 1 or 0, stored by the fuse circuits 356-1, ..., 356-N is successfully transferred to the fuse output 335, e.g., to the latch of the respective circuit. As shown in FIG. 3, the voltage Vca 363 can be higher than the trip voltage Vtrip 361. Hence, if the controller 354 acquires data from the fuse circuits 356-1, ..., 356-N during time period 371, then the acquired data values may be incorrect which can lead to device operation failures.

In one or more embodiments of the present disclosure, the output of at least one of a number of fuses, e.g., fuse circuits 356-1, ..., 356-N, are read in response to a detected state change of the output of another fuse circuit, e.g., output 369 of enable fuse circuit 358. As shown in the embodiment of FIG. 3, the output Eout 369 of the enable fuse 358 changes from a reset state, e.g., a logic low data value, to a second state, e.g., a logic high data value, after time 373. As shown in FIG. 3, the state change of Eout 369 occurs after the output Fout 335 of the fuses 356-1, ..., 356-N has reached a stable value. That is, the stored data value of the number of fuse circuits 356-1, ..., 356-N is properly transferred to a respective fuse latch such that the correct stored data value is presented at Fout 335 prior to the stored data value, e.g., a logic high data value in this example, of the enable fuse circuit 358 being transferred to the latch of fuse circuit 358 and presented at Eout 369.

In one or more embodiments, a ready-busy (R/B) signal 359 rises in accordance with the output Fout 369 of the enable circuit 358. That is, unlike in some previous approaches such as that described in connection with FIG. 2, in the embodiment of FIG. 3, the ready-busy signal 359 is not triggered at the same time as the POR signal 352, e.g., at the time when threshold detector 350 determines the ramping VCC 329 has reached the trip voltage Vtrip 361. As such, a user or customer operation request can be made to controller 354 only after the fuse output 335 of fuse circuits 356-1, ..., 356-N has reached a stable value. Therefore, when the controller retrieves the fuse data from the fuse circuits 356-1, ..., 356-N in response to a program, erase, and/or read operation request, the acquired data will be correct.

Figure 4:
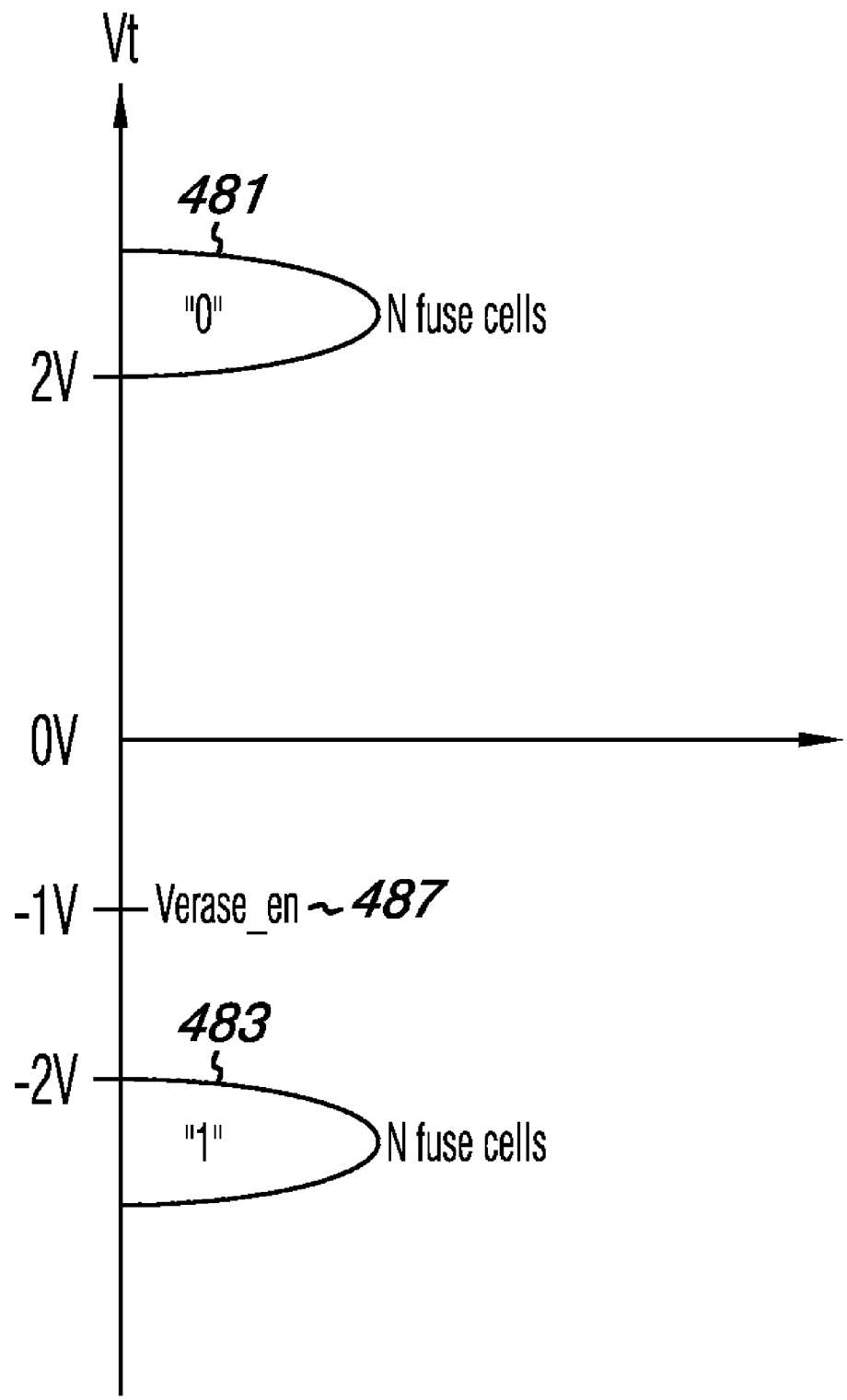
FIG. 4 is a diagram illustrating threshold voltages of fuse memory cells according to an embodiment of the present disclosure.

FIG. 4 is a diagram illustrating threshold voltages (Vt) of fuse memory cells according to an embodiment of the present disclosure. The fuse memory cells can be floating gate memory cells such as memory cells 107 and 108 shown in FIG. 1 and can be fuse cells of fuse circuits such as fuse circuits 356-1, ..., 356-N shown in FIG. 3. As described above, in various embodiments of the present disclosure, a memory cell of a fuse circuit can store a particular data value that can be transferred to a fuse latch during a fuse read operation.

As an example, a fuse memory cell can store a logic "1" if the Vt of the cell corresponds to an erased state and can store a logic "0," if the Vt of the cell corresponds to a programmed state. In one or more embodiments, a fuse memory cell, e.g., fuse memory cell 107 and 108 shown in FIG. 1A, is considered to be in an erased state if its Vt level is a negative Vt level and is considered to be in a programmed state if its Vt level is a positive Vt level. In such embodiments, the fuse memory cell will be activated, e.g., in a conductive state, when a read voltage of 0V is applied to the control gate of the cell, while the cell will be deactivated, e.g., in a non-conductive state, in response to the application of the 0V read voltage. The Vt level of a fuse memory cell can be adjusted, e.g., increased or decreased, via various program and erase operations known to those of ordinary skill in the art.

As described in connection with FIG. 3, one or more embodiments of the present disclosure can include a first fuse circuit, e.g., enable fuse circuit 358, whose output can be reset based on a detected signal, e.g., POR 352, indicating VCC of the device has reached a threshold level, e.g., Vtrip 361. The output, e.g., Eout 369, of the first fuse circuit can be monitored and the outputs of at least a second fuse circuit, e.g., at least one of fuse circuits 356-1, ..., 356-N, can be read in response to a detected state change of the output of the first fuse circuit. In various embodiments, the state change of the output of the first fuse circuit can be from a reset data value to a particular data value stored by a fuse memory cell of the first circuit. In some embodiments, a ready-busy signal, allowing a user to request an operation requiring the controller to acquire fuse data from the output of the at least second fuse circuit, is provided only after the output of the first fuse circuit has changed from a reset data value to a second data value, e.g., from a logic low data value to a logic high data value.

In the embodiment of FIG. 4, the Vt distribution 481 represents a range of Vt levels associated with fuse memory cells of a number of fuse circuits, e.g., fuse circuits 356-1, ..., 356-N shown in FIG. 3, having Vt levels corresponding to a programmed state. In this embodiment, the programmed fuse memory cells have a Vt level of about 2V to 3V. The Vt distribution 483 represents a range of Vt levels associated with fuse memory cells of a number of fuse circuits, e.g., fuse circuits 356-1, ..., 356-N shown in FIG. 3, having a Vt level corresponding to an erased state. In this embodiment, the erased fuse memory cells have a Vt level of about −2V to −3V. In this embodiment, fuse cells having a Vt level within distribution 481 are considered to store a logic "0" data value and fuse cells having a Vt level within distribution 483 are considered to store a logic "1" data value.

The embodiment of FIG. 4 also illustrates a Vt level 487 (Verase_en) to which the Vt level of a fuse memory cell of an enable fuse circuit, e.g., fuse circuit 358 shown in FIG. 3, is adjusted when the fuse memory cell is to be in an erased state. As described in FIG. 1, in some embodiments, a fuse circuit can include a pair of fuse memory elements programmed to store complementary states, e.g., one cell is in a programmed state and the other is in an erased state. In embodiments in which an enable fuse circuit includes memory cells programmed to complementary states, the Vt level of the cell in the erase state can be adjusted to Vt level 487, e.g., −1V in this example, and the Vt level of the cell in the programmed state may be adjusted to a Vt level within distribution 481.

As illustrated in FIG. 4, the Vt levels corresponding to erase Vt distribution 483 are greater in magnitude than Verase_en 487. That is, an erased memory cell of a fuse circuit other than an enable fuse circuit has an erase Vt level greater in magnitude than an erased memory cell of an enable fuse circuit. Embodiments are not limited to the example program and/or erase Vt levels illustrated in FIG. 4. For instance, in some embodiments the Verase_en 487 Vt level can be about −0.5V to about −1.5V.

In embodiments in which the Vt level magnitude of an erased memory cell of an enable fuse circuit is lesser than the Vt level magnitude of a number of other fuse circuits, the time period in which the output of the fuse changes from a reset value to a stable fuse data value can be greater for the enable fuse than for the number of other fuses. That is, the lesser magnitude Vt level for an erased enable fuse memory cell can cause the enable fuse cell to turn on slower and/or can lead to a conduction of a lesser amount of current in response to an applied read voltage, which can cause a data value stored by the erased enable memory cell, e.g., logic data value "1", to be transferred to the enable fuse latch slower than a data valued stored by an erased fuse cell of the number of other fuse circuits is transferred to the latch of the number of fuse circuits.

As such, in various embodiments, acquiring fuse data from a number of fuse circuits of a memory device in response to a detected output change of an enable fuse circuit can reduce or prevent a controller from acquiring incorrect fuse data from the number of fuse circuits. One or more embodiments of the present disclosure provide allow control circuitry of a memory device to obtain correct fuse data from a number of fuse circuits while the power supply voltage of the device is ramping during power on.

Figure 5:
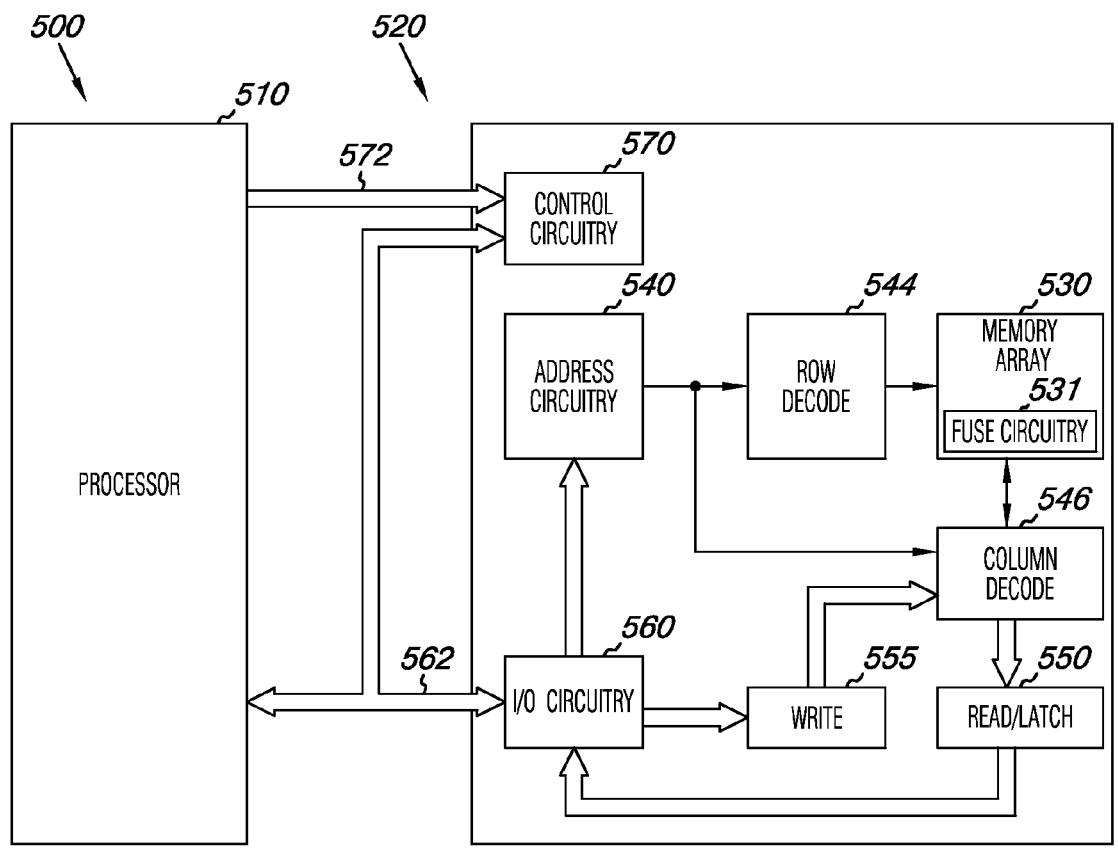
FIG. 5 is a functional block diagram of an electronic memory system having at least one memory device in accordance with an embodiment of the present disclosure.

FIG. 5 is a functional block diagram of an electronic memory system 500 having at least one memory device 520 in accordance with an embodiment of the present disclosure. Memory system 500 includes a processor 510 coupled to a non-volatile memory device 520 that includes a memory array 530 of memory cells. The memory array 530 includes fuse circuitry 531 which can include a number of fuse circuits as described herein. The memory system 500 can include separate integrated circuits or both the processor 510 and the memory device 520 can be on the same integrated circuit. The processor 510 can be a microprocessor or some other type of controlling circuitry such as an application-specific integrated circuit (ASIC).

The memory device 520 can includes an array 530 of non-volatile memory cells, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 5 includes address circuitry 540 to latch address signals provided over I/O connections 562 through I/O circuitry 560. Address signals are received and decoded by a row decoder 544 and a column decoder 546 to access the memory array 530. In light of the present disclosure, it will be appreciated by those skilled in the art that the number of address input connections depends on the density and architecture of the memory array 530 and that the number of addresses increases with both increased numbers of memory cells and increased numbers of memory blocks and arrays.

The memory device 520 reads data from the memory array 530 by sensing voltage and/or current changes in the memory array columns using sense/buffer circuitry that in this embodiment can be read/latch circuitry 550. The read/latch circuitry 550 can read and latch a page or row of data from the memory array 530. I/O circuitry 560 is included for bi-directional data communication over the I/O connections 562 with the processor 510. Write circuitry 555 is included to write data to the memory array 530.

Control circuitry 570 decodes signals provided by control connections 572 and/or I/O connections 562 from the processor 510. These signals can include chip enable signals, write enable signals, address latch signals, and command latch signals that are used to control the operations on the memory array 530, including data read, data write, and data erase operations. In various embodiments, the control circuitry 570 is responsible for executing instructions from the processor 510 to perform the operating embodiments of the present disclosure. The control circuitry 570 can be a controller such as controller 354 shown in FIG. 3 and can acquire fuse data from fuse circuitry 531 according to embodiments described herein. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

Figure 6:
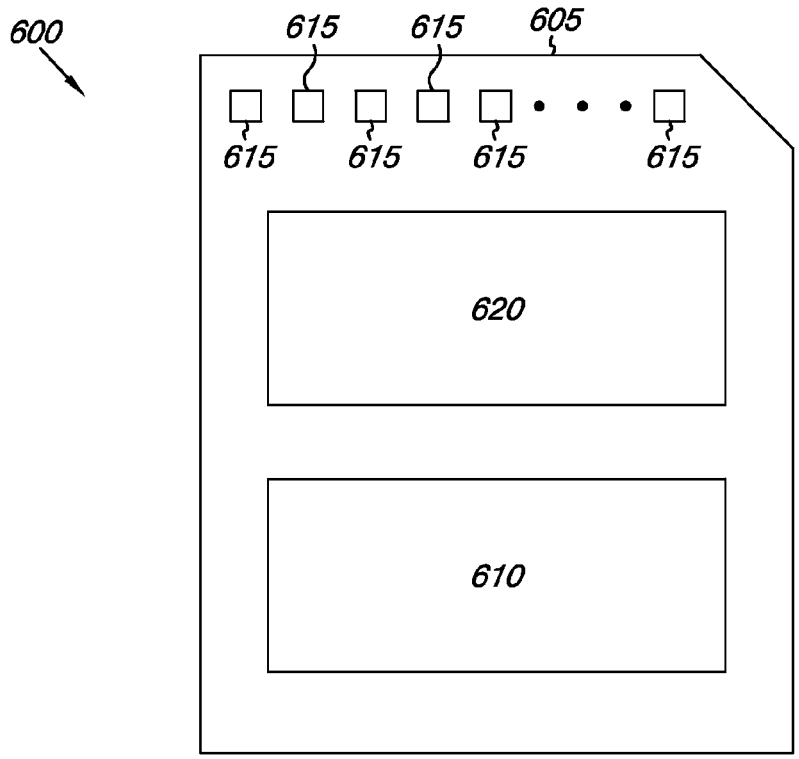
FIG. 6 is a functional block diagram of a memory module having at least one memory device in accordance with an embodiment of the present disclosure.

FIG. 6 is a functional block diagram of a memory module 600 having at least one memory device in accordance with an embodiment of the present disclosure. Memory module 600 is illustrated as a memory card, although the concepts discussed with reference to memory module 600 are applicable to other types of removable or portable memory (e.g., USB flash drives) and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 includes an array of non-volatile memory cells and fuse circuitry that can be operated according to embodiments described herein. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620, which may be one or more integrated circuits and/or discrete components. For some embodiments, the additional circuitry 620 may include control circuitry, such as a memory controller, for controlling access across multiple memory devices 610 and/or for providing a translation layer between an external host and a memory device 610. For example, there may not be a one-to-one correspondence between the number of contacts 615 and a number of 610 connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC. Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

Methods, devices, modules, and systems for operating non-volatile memory cells have been shown. One or more method embodiment includes detecting a signal indicating whether a voltage used during operation of at least one of a number of fuse circuits has reached a threshold level, initializing at least one of the number of fuse circuits in response to detecting that the voltage has reached the threshold level, and reading an output of at least one of the number of fuse circuits at least partially in response to a detected state change of an output of the at least one initialized fuse circuit.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of operating a memory device, the method comprising:
   detecting a signal indicating whether a voltage used during operation of at least one of a number of fuse circuits has reached a threshold level;
   initializing at least one of the number of fuse circuits in response to detecting that the voltage has reached the threshold level; and
   reading an output of at least one of the number of fuse circuits at least partially in response to a detected state change of an output of the at least one initialized fuse circuit.

2. The method of claim 1, wherein detecting that the voltage has reached a threshold level includes receiving a power on reset (POR) signal from a threshold detector indicating the voltage has reached the threshold level.

3. The method of claim 2, wherein detecting the signal indicating whether the voltage has reached the threshold level is performed during power up of the memory device.

4. The method of claim 3, wherein initializing includes providing a signal to a reset transistor coupled to a latch of the at least one fuse circuit being initialized which causes an output of the latch to be at a first state; and
   wherein the method includes:
   detecting when the output of the latch of the at least one initialized fuse circuit changes to a second state; and
   determining a state of an output of a latch of the at least one fuse circuit being read at least partially in response to the detected change to the second state.

5. The method of claim 4, wherein detecting includes detecting when the output of the latch of the at least one initialized fuse circuit changes from a logic low state to a logic high state.

6. The method of claim 1, wherein the at least one fuse circuit being initialized and the at least one fuse circuit being read include a programmable element and a latch to which data stored by the element is transferred during a read of the fuse circuits, and wherein the method includes programming the element of the at least one fuse circuit being reset differently than the element of the at least one fuse circuit being read.

7. The method of claim 6, wherein the method includes:
   adjusting a floating gate transistor of the programmable element of the at least one fuse circuit being initialized to a first threshold voltage (Vt) level; and
   adjusting a floating gate transistor of the programmable element of the at least one fuse circuit being read to a second Vt level, wherein the second Vt level is greater in magnitude than the first Vt level.

8. The method of claim 7, wherein the method includes:
   adjusting the floating gate transistor of the programmable element of the at least one fuse circuit being initialized to a first Vt level that is between about −0.05V and −1.0V; and
   adjusting the floating gate transistor of the programmable fuse element of the at least one fuse circuit being read to a second Vt level that is between about −2.0V and −3.0V.

9. A method of operating a memory device having a number of fuse circuits, the method comprising:
   storing a data value in a memory cell of a fuse circuit by adjusting a threshold voltage (Vt) level of the cell to a first Vt level;
   storing the data value in a memory cell of at least one other fuse circuit by adjusting a Vt level of the cell of the at least one other fuse circuit to a second Vt level, the second Vt level greater in magnitude than the first Vt level;
   while a voltage used during operation of the device is ramping, providing a reset signal to the fuse circuit having the memory cell adjusted to the first Vt level at least partially in response to detecting that the voltage has reached a threshold level, wherein, an output of a latch of the fuse circuit having the memory cell adjusted to the first Vt level is reset to a reset data value;

initiating a transfer of the stored data value from the memory cell adjusted to the first Vt level to the latch and initiating a transfer of the stored data value from the memory cell of the at least one other fuse circuit having the memory cell adjusted to the second Vt level to an other latch;

detecting when the output of the latch of the fuse circuit having the memory cell adjusted to the first Vt level changes from the reset data value to the stored data value; and reading an output of the an other latch of the at least one other fuse circuit having the memory cell adjusted to the second Vt level after detecting the output change of the latch of the fuse circuit having the memory cell adjusted to the first Vt level.

10. The method of claim 9, wherein initiating the transfer of the stored data value to the latch of the fuse circuit having the memory cell adjusted to the first Vt level includes:

applying a ramping voltage to an input node of the fuse circuit having the memory cell adjusted to the first Vt level; and applying a read voltage to a control gate of the memory cell adjusted to the first Vt level, the read voltage sufficient to place the memory cell adjusted to the first Vt level in a conducting state.

11. The method of claim 10, wherein initiating the transfer of the stored data value to the an other latch of the at least one other fuse circuit having the memory adjusted to the second Vt level includes:

applying the ramping voltage to an input node of the at least one other fuse circuit; and applying the read voltage to a control gate of the memory cell adjusted to the second Vt level.

12. The method of claim 11, wherein applying the read voltage includes:

applying a read voltage of about 0V to the control gate of the memory cell adjusted to the first Vt level; and applying the read voltage of about 0V to the control gate of the memory cell adjusted to the second Vt level.

13. The method of claim 10, wherein the method includes providing a signal that indicates when commands can be given for the memory device to operate at least partially in response to the detected output change of the latch of the fuse circuit having the memory cell adjusted to the first Vt level.

14. The method of claim 10, wherein the method includes erasing the memory cell of the fuse circuit having the memory cell adjusted to the first Vt level and erasing the memory cell of the at least one other fuse circuit having the memory cell adjusted to the second Vt level.

15. The method of claim 14, wherein the method includes:

storing an other data value in a memory cell of at least a third fuse circuit by adjusting a Vt level of the cell of the at least the third fuse circuit to a third Vt level, the third Vt level corresponding to a programmed state;

initiating a transfer of the an other stored data value from the memory cell of the at least the third fuse circuit having the memory cell adjusted to the third Vt level to a latch of the at least the third fuse circuit; and reading an output of the latch of the at least the third fuse circuit having the memory cell adjusted to the third Vt level after detecting the output change of the latch of the fuse circuit having the memory cell adjusted to the first Vt level.

16. The method of claim 15, wherein initiating the transfer of the an other stored data value to the latch of the at least the third fuse circuit includes:

applying the ramping voltage to an input node of the at least the third fuse circuit; and applying the read voltage to a control gate of the memory cell of the at least the third fuse circuit having the memory cell adjusted to the third Vt level, the read voltage insufficient to place the memory cell adjusted to the third Vt level in a conducting state.

17. A memory device, comprising:

an array of memory cells;

a number of fuse circuits programmed to store data associated with operating the array; and control circuitry coupled to the array and configured to:

initialize an output of at least one fuse circuit of the number of fuse circuits to a reset data value at least partially in response to detecting that a supply voltage has reached a threshold level;

detect when the output of the at least one initialized fuse circuit changes from the reset data value to a data value stored by a memory cell of the at least one initialized fuse circuit; and retrieve data from an output of at least an other one of the number of fuse circuits at least partially in response to the detected output change.

18. The memory device of claim 17, wherein the memory cell of the at least one initialized fuse circuit has a first threshold voltage (Vt) level corresponding to the stored data value, the first Vt level is such that the memory cell of the at least one initialized fuse circuit is in a conductive state when a particular read voltage is applied to its control gate.

19. The memory device of claim 18, wherein the at least the other one of the number of fuse circuits includes a memory cell having a second Vt level greater in magnitude than the first Vt level of the memory cell of the at least one initialized fuse circuit such that the memory cell having the second Vt level is in a conductive state when the particular read voltage is applied to its control gate.

20. The memory device of claim 19, wherein:

the at least one initialized fuse circuit includes a latch to which the stored data value is transferred when the particular read voltage is applied to the memory cell having the first Vt level; and the at least the other one of the number of fuse circuits includes a latch to which data stored by the memory cell having the second Vt level is transferred when the particular read voltage is applied to the memory cell having the second Vt level.

21. The memory device of claim 17, wherein the control circuitry is configured to provide a ready-busy signal in response to the detected output change of the at least one initialized fuse circuit.

22. The memory device of claim 17, wherein the memory cell of the at least one initialized fuse circuit and the memory cell of the at least the other one of the number of fuse circuits are floating gate memory cells.

23. The memory device of claim 17, wherein the array is a NAND array of floating gate memory cells.

24. The memory device of claim 17, wherein the device includes a threshold detector from which a signal is received while the supply voltage is ramping during power up of the device, the signal indicating that the supply voltage has reached the threshold level.

25. The memory device of claim 17, wherein the data retrieved from the output of the at least the other one of the number of fuse circuits includes address redundancy data associated with the array of memory cells.

26. The memory device of claim 17, wherein the data retrieved from the output of the at least the other one of the number of fuse circuits includes trim value data associated with operating the array of memory cells.

27. The memory device of claim 17, wherein each of the number of fuse circuits include at least two floating gate memory cells having their control gates coupled to a common select line and which are programmed to store complementary data values.

28. A fuse circuit of a memory device, the fuse circuit comprising:

a memory cell having a first threshold voltage (Vt) level corresponding to a stored data value;

a latch to which the stored data value is transferred when a read voltage sufficient to place the memory cell in a conductive state is applied to a control gate of the memory cell; and wherein the first Vt level is lesser in magnitude than a second Vt level to which a memory cell of a number of other fuse circuits of the device are adjusted, and wherein data values stored by the number of other fuse circuits are retrieved during power up of the device after control circuitry of the device:

resets an output of the latch to a reset value different than the stored data value in response to a voltage used during operation of at least one the fuse circuits reaching a threshold value; and detects a change of the output of the latch from the reset value to the stored data value.

* * * * *